(12) United States Patent
Yan et al.

(10) Patent No.: US 6,610,447 B2
(45) Date of Patent: Aug. 26, 2003

(54) EXTREME ULTRAVIOLET MASK WITH IMPROVED ABSORBER

(75) Inventors: Pei-Yang Yan, Saratoga, CA (US); Guojing Zhang, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 09/823,641

(22) Filed: Mar. 30, 2001

(65) Prior Publication Data

US 2002/0142230 A1 Oct. 3, 2002

(51) Int. Cl.[7] .................................................. G03F 9/00
(52) U.S. Cl. .......................................................... 430/5
(58) Field of Search ............................ 430/5, 322, 296; 378/34, 35

(56) References Cited

U.S. PATENT DOCUMENTS

| | | | | |
|---|---|---|---|---|
| 4,840,922 A | * | 6/1989 | Kobayashi et al. | 437/129 |
| 5,196,283 A | * | 3/1993 | Ikeda et al. | 430/5 |
| 5,641,593 A | | 6/1997 | Watanabe et al. | |
| 5,939,227 A | * | 8/1999 | Smith | 430/5 |
| 5,958,629 A | * | 9/1999 | Yan et al. | 430/5 |
| 6,355,381 B1 | * | 3/2002 | Yan et al. | 430/5 |
| 6,366,639 B1 | * | 4/2002 | Ezaki et al. | 378/34 |

FOREIGN PATENT DOCUMENTS

JP  08 213303 A  8/1996

OTHER PUBLICATIONS

Mangat, P.J.S. et al., "Surface Modification and Cleaning Enhancement of TaSi(N) Films With Dilute Hydrofluoric Acid", 46th National Symposium of the American Vacuum Society, Vacuum, Surfaces, and Films, Seattle WA, Oct. 1999, vol. 18, No. 4, pt. 1–2, pp. 1211–1215, XP008008099.
Li, D.C. et al. "Tungsten Absorber on Silicon Membrane X–ray Masks", 7th International Conference on Solid Films and Surfaces, Hsinchu, Taiwan, Dec. 1994, vol. 92, pp. 665–672, XP002213865.
Mangat, P.J.S. et al. "Extreme Ultraviolet Lithography Mask Patterning and Printability Studies with a Ta–based Absorber", 43rd International Conference on Electron, Ion, and Photo Beam Technology, and Nanofabrication, Marco Island, FL, Jun. 1999, vol. 17, No. 6, pp. 3029–3022, XP002213866.
Takahashi M. et al. "Smooth Low–Stress Sputtered Tantalum and Tantalum Alloy Films for the Absorber Material of Reflective–Type EUVL", Emerging Lithographic Technologies IV, Santa Clara, CA, Feb./Mar. 2000, vol. 3997, pp. 484–495, XP008008100.
International Search Report PCT/US 02/04914.

* cited by examiner

Primary Examiner—S. Rosasco
(74) Attorney, Agent, or Firm—George Chen

(57) ABSTRACT

The present invention discloses an EUV mask having an improved absorber layer with a certain thickness that is formed from a metal and a nonmetal in which the ratio of the metal to the nonmetal changes through the thickness of the improved absorber layer and a method of forming such an EUV mask.

7 Claims, 2 Drawing Sheets

EXTREME ULTRAVIOLET MASK WITH IMPROVED ABSORBER

BACKGROUND OF THE INVENTION

1. Field of the Invention

The present invention relates to the field of semiconductor integrated circuit manufacturing, and more specifically, to a mask and a method of fabricating a mask used in extreme ultraviolet (EUV) lithography.

2. Discussion of Related Art

Continual improvements in optical lithography have allowed the shrinkage of semiconductor integrated circuits (IC) to produce devices with higher density and better performance. Decreasing the wavelength used for exposure improves resolution and mitigates the effects of diffraction. Deep ultraviolet (DUV) light with a wavelength of 248 or 193 nanometers (nm) is widely used for exposure through a transmissive mask fabricated from a quartz substrate. DUV light with a wavelength of 157 or 126 nm may be used for exposure through a transmissive mask made from Calcium Fluoride. However, at around the 70-nm node, Next Generation Lithography (NGL) will be needed.

NGL includes EUV lithography, electron projection lithography (EPL), and proximity x-ray lithography (PXL). PXL has been characterized the most extensively, but this technology is constrained by the requirement for a synchroton source and the difficulty of scaling down the 1X-masks. EPL is suitable for application specific integrated circuits (ASIC), but throughput is significantly degraded whenever complementary structures are patterned since two passes are required with a stencil mask. EUV lithography is best suited for manufacturing of memory chips and microprocessors since the high costs of an EUV mask and an EUV source can be spread over a higher volume of product.

EUV lithography is based on exposure with the portion of the electromagnetic spectrum having a wavelength of 10–15 nanometers. An EUV step-and-scan tool may have a 4-mirror, 4x-reduction projection system with a 0.10 Numerical Aperture (NA). Exposure is accomplished by stepping fields over a wafer and scanning an arc-shaped region of the EUV mask across each field. A critical dimension (CD) of 50–70 nm may be achieved with a depth of focus (DOF) of about 1 micrometer (um). Alternatively, an EUV step-and-scan tool may have a 6-mirror, 4x-reduction projection system with a 0.25 NA to print a smaller CD of 20–30 nm, at the expense of a reduced DOF. Other tool designs with a 5x- or a 6x-reduction projection system may also be used for EUV lithography.

A mask for DUV lithography is transmissive. Thus, the desired pattern on a DUV mask is defined by selectively removing an opaque layer, such as Chrome, to uncover portions of an underlying transparent substrate, such as quartz. However, virtually all condensed materials absorb at the EUV wavelength so a mask for EUV lithography is reflective. Consequently, the desired pattern on an EUV mask is defined by selectively removing an absorber layer to uncover portions of an underlying mirror coated on a substrate.

Thus, what is needed is an EUV mask with an improved absorber layer and a method of fabricating such an EUV mask.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Nearly all materials absorb Extreme Ultraviolet (EUV) light so a mask for EUV lithography is reflective. A pattern on an EUV mask is defined by selectively removing portions of an absorber layer to uncover an underlying mirror. The absorber layer controls critical dimension (CD), defect level, and registration. Thus, the absorber layer on an EUV mask has a direct impact on the quality of the mask. The present invention is an EUV mask with an improved absorber layer and a method of fabricating such an EUV mask.

Figure 1A:
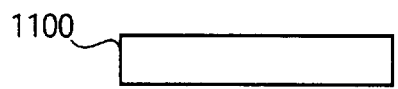
FIGS. 1(a)–(d) are illustrations of a cross-sectional view of an EUV mask blank with an improved absorber layer formed according to the present invention.

Various embodiments of a process for fabricating an EUV mask according to the present invention will be described next. First, as shown in FIG. 1(a), a substrate 1100 with a low defect level and a smooth surface is used as the starting material for an EUV mask of the present invention. It is desired to form the substrate 1100 out of a glass or glass-ceramic material that has a low coefficient of thermal expansion (CTE). In certain cases, the substrate 1100 may be formed from Silicon despite its large CTE as long as heat can be removed uniformly and effectively during exposure.

Figure 1B:
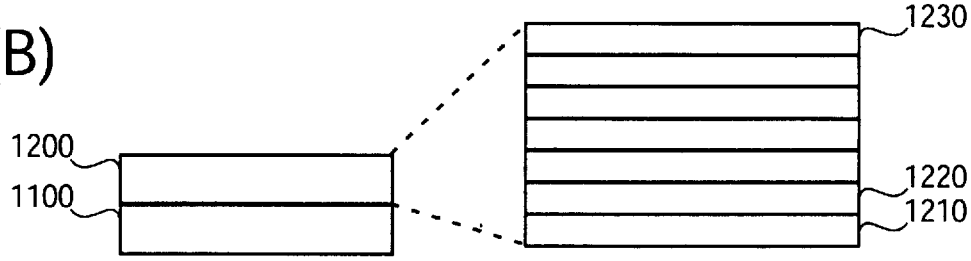
Figure 1C:
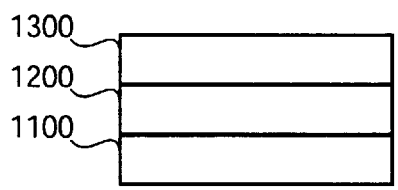
Figure 1D:
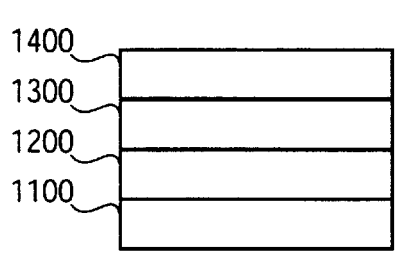
Figure 2A:
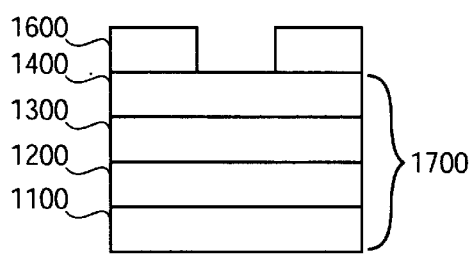
FIGS. 2(a)–(d) are illustrations of a cross-sectional view of an EUV mask with an improved absorber layer formed according to the present invention.
Figure 2B:
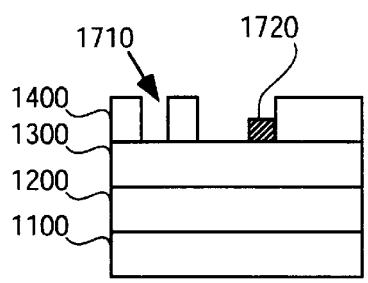
Figure 2C:
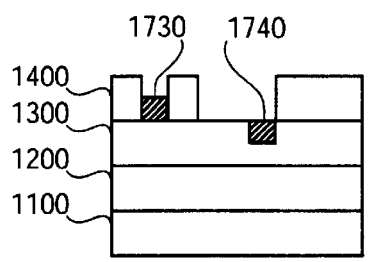
Figure 2D:
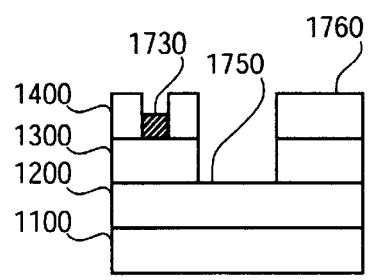

Second, as shown in FIG. 1(b), a multilayer (ML) mirror 1200 is formed over the substrate 1100. The ML mirror 1200 has about 20–80 pairs of alternating layers of a high index of refraction material 1210 and a low index of refraction material 1220. A high index of refraction material 1210 includes elements with high atomic number which tend to scatter EUV light. A low index of refraction material 1220 includes elements with low atomic number which tend to transmit EUV light.

The choice of materials in the ML mirror 1200 depends on the illumination wavelength, lambda. To a first approximation, each layer has a thickness of about one quarter of lambda. More specifically, the thickness of the individual layers depends on the illumination wavelength, lambda, and the incidence angle of the illumination light. For EUV, the wavelength is about 13.4 nm and the incidence angle is about 5 degrees. The thicknesses of the alternating layers are tuned to maximize the constructive interference of the EUV light reflected at each interface and to minimize the overall absorption of the EUV light. The ML mirror 1200 can achieve about 60–75% reflectivity at the peak illumination wavelength.

In one embodiment, the ML mirror 1200 has 40 pairs of alternating layers of a high index of refraction material 1210 and a low index of refraction material 1220. For example, the high index of refraction material 1210 may be formed from about 2.8 nm thick Molybdenum (Mo) while the low index of refraction material 1220 may be formed from about 4.1 nm thick Silicon (Si). As needed, a capping layer 1230, such as about 11.0 nm thick Silicon (Si), may be formed at the top of the ML mirror 1200 to prevent oxidation of Molybdenum by exposure to the environment.

The ML mirror 1200 is formed over the substrate 1100 by using ion beam deposition (IBD) or DC magnetron sputtering. The thickness uniformity should be better than 0.8% across the substrate 1100. IBD results in less perturbation and fewer defects in the upper surface of the ML mirror 1200 because the deposition conditions can usually be optimized to smooth over any defect on the substrate 1100. DC magnetron sputtering is more conformal, thus producing better thickness uniformity, but any defect on the substrate 1100 will tend to propagate up through the alternating layers to the upper surface of the ML mirror 1200.

Third, as shown in FIG. 1(*c*), a buffer layer 1300 is formed over the ML mirror 1200. The buffer layer 1300 may have a thickness of about 20–105 nm. The buffer layer 1300 may be formed from Silicon Dioxide ($SiO_2$), such as a low temperature oxide (LTO). A low process temperature, typically less than about 150 C., is desirable to prevent interdiffusion of the alternating layers in the underlying ML mirror 1200. Other materials, such as Silicon Oxynitride ($SiOxNy$) or Carbon (C) may also be used for the buffer layer 1300. The buffer layer 1300 may be deposited by RF magnetron sputtering.

Fourth, as shown in FIG. 1(*d*), an improved absorber layer 1400 is formed over the buffer layer 1300. The improved absorber layer 1400 may be formed from one type of material or from a stack of different materials. Variation in the layer, if present, may be continuous or may be discrete with distinct interfaces. In one embodiment, the improved absorber layer 1400 is formed from Tantalum Nitride (TaN) in which the stoichiometry is changed through the thickness of the film.

The improved absorber layer 1400 has a total thickness of about 45–215 nm. In most cases, the improved absorber layer 1400 may be deposited by RF sputtering. Depending on the material selected, the improved absorber layer 1400 may be deposited by DC sputtering. In some cases, the improved absorber layer 1400 may be deposited by ion beam deposition (IBD) or atomic layer chemical vapor deposition (ALC).

The improved absorber layer 1400 may be formed entirely or partially out of one or more metals and their borides, carbides, nitrides, oxides, phosphides, or sulfides. Examples of suitable metals include Tantalum (Ta), Tungsten (W), Hafnium (Hf), and Niobium (Nb).

The improved absorber layer 1400 may also be formed from amorphous alloys of metals. Examples include Tantalum Silicon (TaSi) and Tantalum Germanium (TaGe).

As shown in FIG. 1(*d*), the combination of an improved absorber layer 1400, buffer layer 1300, ML mirror 1200, and substrate 1100 results in an EUV mask blank 1700. The EUV mask blank 1700 shown in FIG. 1(*d*) can be further processed to produce an EUV mask 1800 as shown in FIG. 2(*d*).

First, as shown in FIG. 2(*a*), an EUV mask blank 1700 is covered with a radiation-sensitive layer, such as photoresist 1600, that is coated, exposed, and developed with a desired pattern. The photoresist 1600 has a thickness of about 160–640 nm. As desired, a chemically-amplified resist (CAR) may be used. Depending on the photoresist 1600 used, exposure is performed on an electron beam (e-beam) writer or a laser writer.

After post-develop measurement of the critical dimension (CD) of the features in the pattern in the photoresist 1600, the pattern is transferred into the improved absorber layer 1400 as shown in FIG. 2(*b*). Reactive ion etch may be used. For example, an improved absorber layer 1400 may be dry etched with a gas which contains Chlorine, such as $Cl_2$ or $BCl_3$, or with a gas which contains Fluorine, such as $NF_3$. Argon (Ar) may be used as a carrier gas. In some cases, Oxygen ($O_2$) may also be included. The etch rate and the etch selectivity depend on power, pressure, and substrate temperature.

The buffer layer 1300 serves as an etch stop layer to help achieve a good etch profile in the overlying improved absorber layer 1400. The buffer layer 1300 protects the underlying ML mirror 1200 from damage during etch of the improved absorber layer 1400.

Reactive ion etch may not be feasible for patterning the improved absorber layer 1400 if the byproducts of etching are not volatile and thus cannot be removed from the chamber by pumping. Then the improved absorber layer 1400 may be patterned with a sputtering process in an Argon plasma. If desired, a dual frequency high-density plasma may be used. Alternatively, if selectivity to the masking material is adequate, ion milling may be used to pattern the improved absorber layer 1400.

Removal of the photoresist 1600 is followed by post-etch measurement of the CD of the features in the pattern in the improved absorber layer 1400. The CD measurement may be done with a scanning electron microscope (SEM) or an optical metrology tool. Then defect inspection is done at a wavelength typically between 150–500 nm. The defect inspection is based on a comparison of the light signals in the patterned regions relative to the non-patterned regions.

As shown in FIG. 2(*b*), defects may occur in the improved absorber layer 1400 as a result of the pattern transfer from the photoresist 1600. A first type of defect is a clear defect 1710 while a second type of defect is an opaque defect 1720. In a clear defect 1710, the improved absorber layer 1400 should be present, but it is entirely or partially missing. In an opaque defect 1720, the improved absorber layer 1400 should be removed, but it is entirely or partially present.

Repair of defects in the improved absorber layer 1400 is performed with a focused ion beam (FIB) tool as needed as shown in FIG. 2(*c*). A clear defect 1710 is filled in with an opaque repair material 1730. An opaque defect 1720 is removed, leaving a Gallium stain 1740 in the underlying buffer layer 1300. Thus, the buffer layer 1300 also protects the underlying ML mirror 1200 from damage during repair of the improved absorber layer 1400.

The buffer layer 1300 increases light absorption over the ML mirror 1200 when the EUV mask 1720 is used during exposure of photoresist on a wafer. The resulting reduction in contrast can slightly degrade CD control of the features printed in the photoresist on a wafer. Throughput is also decreased. As a result, it is desirable to remove the buffer layer 1300 wherever it is not covered by the improved absorber layer 1400 as shown in FIG. 2(*d*).

The buffer layer 1300 may be removed with a dry etch or a wet etch or a combination of the two processes. The dry etch or wet etch used to remove the buffer layer 1300 must not damage the overlying improved absorber layer 1400 or the underlying ML mirror 1200.

The buffer layer 1300 may be dry etched with a gas which contains Fluorine, such as $CF_4$ or $C_4F_8$. Oxygen ($O_2$) and a carrier gas, such as Argon (Ar), may be included. A dry etch provides a steeper profile and a smaller undercut in the buffer layer 1300.

The buffer layer 1300 may also be wet etched, especially if it is very thin, since any undercut would then be very small. For example, a buffer layer 1300 formed from Silicon Dioxide (SiO$_2$) may be etched with an aqueous solution of about 3–5% hydrofluoric (HF) acid. A wet etch can compensate for larger variations in thickness of the buffer layer 1300.

The result of the process described above is an EUV mask 1800 having a reflective region 1750 and a dark region 1760, as shown in FIG. 2(*d*).

Figure 3:
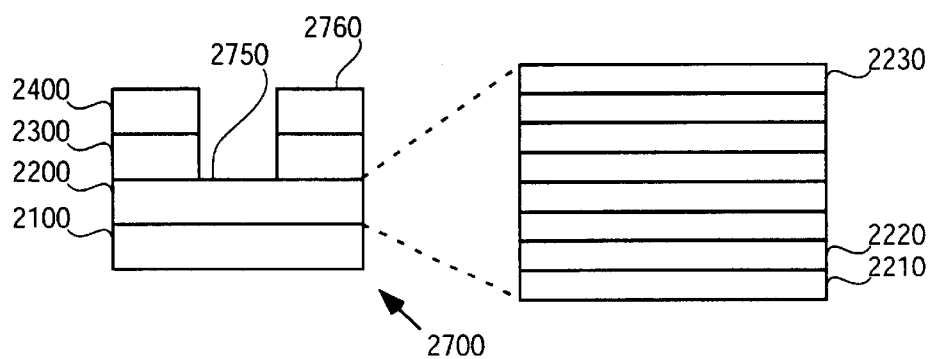
FIG. 3 is an illustration of a cross-sectional view of an EUV mask with an improved absorber layer according to the present invention.

Another embodiment of the present invention is an EUV mask 2700 as shown in FIG. 3. An EUV mask 2700 includes an improved absorber layer 2400, a buffer layer 2300, an ML mirror 2200, and a substrate 2100. The EUV mask 2700 has a first region 2750 and a second region 2760. The first region 2750 is reflective because the ML mirror 2200 is uncovered. The second region 2760 is darker due to the top layer 2500 and the improved absorber layer 2400.

First, the EUV mask 2700 of the present invention includes a substrate 2100 with a low defect level and a smooth surface is used as the starting material for an EUV mask of the present invention. The substrate 2100 should have a low coefficient of thermal expansion (CTE). The substrate 2100 may be a low CTE glass or a low CTE glass-ceramic. However, in some cases, the substrate 2100 is Silicon. Although Silicon has a large CTE that may result in undesirable displacement of printed images, Silicon also has a high thermal conductivity and thus is a viable substrate as long as heat can be removed efficiently from the mask during exposure.

Second, a multilayer (ML) mirror 2200 is disposed over the substrate 2100. The ML mirror 2200 has about 20–80 pairs of alternating layers of a high index of refraction material 2210 and a low index of refraction material 2220. A high index of refraction material 2210 includes elements with high atomic number which tend to scatter EUV light. A low index of refraction material 2220 includes elements with low atomic number which tend to transmit EUV light.

The choice of materials in the ML mirror 2200 depends on the illumination wavelength, lambda. To a first approximation, each layer has a thickness of about one quarter of lambda. More specifically, the optimal thickness of the individual layers depends on the illumination wavelength, lambda, and the incidence angle of the illumination light. For EUV, the wavelength is about 13.4 nm and the incidence angle is about 5 degrees. The optimal thicknesses of the alternating layers maximize the constructive interference of the EUV light reflected at each interface and minimize the overall absorption of the EUV light. The ML mirror 2200 has about 60–75% reflectivity at the peak illumination wavelength.

In one embodiment, the ML mirror 2200 has 40 pairs of alternating layers of a high index of refraction material 2210 and a low index of refraction material 2220. The high index of refraction material 2210 may include Molybdenum (Mo) with a thickness of about 2.8 nm while the low index of refraction material 2220 may include Silicon (Si) with a thickness of about 4.1 nm. As needed, a capping layer 2230, such as about 11.0 nm thick Silicon (Si), may be included at the top of the ML mirror 2200 to prevent oxidation of Molybdenum by the environment.

Third, a buffer layer 2300 is disposed over the ML mirror 2200. The buffer layer 2300 may have a thickness of about 20–105 nm. The buffer layer 2300 protects the underlying ML mirror 2200 from damage by acting as an etch stop layer during etch of the absorber layer 2400. The buffer layer 2300 also protects the underlying ML mirror 2200 from damage during repair of the improved absorber layer 2400.

The buffer layer 2300 may be Silicon Dioxide (SiO$_2$), such as low temperature oxide (LTO). Other materials, such as Silicon Oxynitride (SiOxNy) or Carbon (C) may also be used for the buffer layer 2300.

Fourth, an improved absorber layer 2400 is disposed over the buffer layer 2300. The improved absorber layer 2400 may have a thickness of about 45–215 nm. The improved absorber layer 2400 must absorb EUV light strongly, remain physically and chemically stable during exposure to EUV light, and be compatible with the entire mask fabrication process, including photoresist patterning, absorber etch, photoresist removal, FIB repair, and buffer layer removal. Control of the critical dimension (CD) must be maintained and line edge roughness (LER) must be minimized.

It is desirable for the improved absorber layer 2400 to be as thin as practicable in order to minimize any shadowing effect during exposure. In one embodiment, the improved absorber layer 2400 is Tantalum Nitride with a thickness of 50–100 nm. The EUV illumination beam typically has an incidence angle of about 5 degrees so minimizing any shadowing during exposure will reduce print bias. Similarly, minimizing any shadowing during etch of the improved absorber layer 2400 will reduce etch bias. The etch bias for Tantalum Nitride can be reduced to less than 10 nm. Reducing print bias and etch bias will make it easier for the e-beam writer to resolve the features to be patterned on the EUV mask 2700 and thus will permit the scaling to smaller design rules where the dense features are limited by the pitch. Tantalum Nitride should be extendible down to the 30 nm design rule generation.

The CTE of the improved absorber layer 2400 should be fairly closely matched with the CTE of the other materials in the EUV mask 2700. In general, a low coefficient of thermal expansion (CTE) is desirable for the improved absorber layer 2400. Furthermore, a high thermal conductivity in the improved absorber layer 2400 is helpful in minimizing hot spots during exposure of the EUV mask 2700.

Reducing the thickness of the improved absorber layer 2400 is further advantageous since the stress in the film will also be decreased. Mechanical stress in the film is undesirable since it may lead to distortion of the pattern on the EUV mask 2700 during e-beam writing of the EUV mask 2700. Excessive stress may also distort the pattern printed on the wafer during exposure of the EUV mask 2700.

Over a wide range of wavelength, lambda, the absorption coefficient of an element with a density, rho, and an atomic number, Z, is proportional to $(rho)(Z)^4(lambda)^3$. Elements from period 6 and group 4–11 of the periodic table are potentially good candidates for the improved absorber layer 2400. Examples of elements which have large rho and large Z include Hafnium (rho=13.30 g/cm$^3$, Z=72), Tantalum (rho=16.60 g/cm$^3$, Z=73), Tungsten (rho=19.35 g/cm$^3$, Z=74), Rhenium (rho=20.53 g/cm$^3$, Z=75), Osmium (rho=22.48 g/cm$^3$, Z=76), Platinum (rho=21.45 g/cm$^3$, Z=78), and Gold (rho=19.32 g/cm$^3$, Z=79). These elements may all be deposited with either DC sputtering or RF sputtering.

It is desirable for the improved absorber layer 2400 to have good adhesion to the underlying buffer layer 2300 and, as needed, to any overlying opaque repair material. In most, but not all, cases, hardness is also beneficial in contributing to the overall robustness of the EUV mask 2700. Tantalum forms good films. Tungsten films are hard and adherent, although the oxides are volatile. In certain cases, Rhenium films will self-evaporate. However, both Platinum films and Gold films are soft and have poor adhesion.

Certain alloys and ceramics are also suitable for the improved absorber layer 2400. Examples of amorphous alloys include Tantalum Silicon and Tantalum Germanium. Examples of ceramics include Tungsten Carbide (rho=17.15 g/cm$^3$), Tantalum Nitride (rho=16.30 g/cm$^3$), Tantalum Carbide (rho=13.90 g/cm$^3$), Hafnium Carbide (rho=12.20 g/cm$^3$), Tantalum Boride (rho=11.15 g/cm$^3$), and Hafnium Boride (rho=10.50 g/cm$^3$). These ceramics may be formed by DC sputtering or RF sputtering. Tungsten Boride (rho=10.77 g/cm$^3$) may be formed by RF sputtering. Tantalum Nitride may also be formed by Reactive RF sputtering. Tantalum may be evaporated in 10$^{-3}$ Torr Nitrogen.

The improved absorber layer 2400 may include one type of material or may be a stack of different materials. Variation in the layer, if desired, may be continuous or may be discrete with distinct interfaces. For example, in one embodiment, the improved absorber layer 2400 is a Ta$_x$N$_y$ film or Tantalum doped with Nitrogen in which x=1 and y<0.6. In another embodiment, the improved absorber layer 2400 is Tantalum Nitride (TaN) in which the stoichiometry changes through the thickness of the film.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described an EUV mask with an improved absorber layer and a method of fabricating such an EUV mask.

We claim:

1. A method comprising:

providing a substrate;

forming a multilayer mirror over said substrate, said multilayer mirror being reflective at a wavelength;

forming an improved absorber layer over said multilayer mirror, said improved absorber layer being absorbent at said wavelength, said improved absorber layer having a thickness, said improved absorber layer comprising a first element doped with a second element, wherein a ratio of said second element to said first element is less than 0.6 to 1.0, wherein said ratio changes through said thickness; and removing said improved absorber layer in a first region while leaving said improved absorber layer in a second region.

2. The method of claim 1 wherein said first element comprises Tantalum.

3. The method of claim 1 wherein said first element comprises Hafnium.

4. The method of claim 1 wherein said first element comprises Tungsten.

5. The method of claim 1 wherein said second element comprises Nitrogen.

6. The method of claim 1 wherein said second element comprises Carbon.

7. The method of claim 1 wherein said second element comprises Boron.

* * * * *